United States Patent
Yamanaka et al.

(10) Patent No.: US 11,935,820 B2
(45) Date of Patent: Mar. 19, 2024

(54) SEMICONDUCTOR DEVICE

(71) Applicant: Sansha Electric Manufacturing Co., Ltd., Osaka (JP)

(72) Inventors: Tomohiro Yamanaka, Osaka (JP); Yoichi Makimoto, Osaka (JP)

(73) Assignee: SANSHA ELECTRIC MANUFACTURING CO., LTD., Osaka (JP)

( * ) Notice: Subject to any disclaimer, the term of this patent is extended or adjusted under 35 U.S.C. 154(b) by 298 days.

(21) Appl. No.: 17/413,962

(22) PCT Filed: Nov. 20, 2020

(86) PCT No.: PCT/JP2020/043338
§ 371 (c)(1),
(2) Date: Jun. 15, 2021

(87) PCT Pub. No.: WO2021/192409
PCT Pub. Date: Sep. 30, 2021

(65) Prior Publication Data
US 2022/0181226 A1    Jun. 9, 2022

(30) Foreign Application Priority Data

Mar. 23, 2020  (JP) ................................ 2020-051584

(51) Int. Cl.
*H01L 23/495*    (2006.01)
*H01L 23/31*    (2006.01)
(Continued)

(52) U.S. Cl.
CPC .... *H01L 23/49568* (2013.01); *H01L 23/3121* (2013.01); *H01L 23/49524* (2013.01);
(Continued)

(58) Field of Classification Search
None
See application file for complete search history.

(56) References Cited

U.S. PATENT DOCUMENTS 5,373,105 A    12/1994 Nagaune et al.
5,763,946 A *  6/1998 Nakadaira ......... H01L 23/49861
                                                        257/730
(Continued)

FOREIGN PATENT DOCUMENTS

| JP | H5136333 A | 6/1993 |
| JP | 201365598 A | 4/2013 |
| JP | 2016157826 A | 9/2016 |

*Primary Examiner* — Michelle Mandala
*Assistant Examiner* — Jordan M Klein
(74) *Attorney, Agent, or Firm* — Kilyk & Bowersox, P.L.L.C.

(57) ABSTRACT

An object is to suppress a lift of an external terminal when an external force is applied, thereby improving the reliability of a semiconductor device. A heat radiating plate 10 having on one main surface a circuit area 54 in which a semiconductor element 50 is arranged, a pair of terminals 31 and 32 connected to the semiconductor element 50, a resin housing 20 that covers the circuit area 54 of the heat radiating plate 10 to seal the semiconductor element 50, and has a terminal surface 22 formed on an upper surface, a pair of side surfaces in the longitudinal direction, and a pair of front and rear surfaces in the lateral direction, are included. The resin housing 20 has a pair of bending contact portions 22e and 23e that come into respectively contact with the pair of terminals 31 and 32 to define bending positions of the terminals 31 and 32. The pair of bending contact portions 22e and 23e are formed to have different heights. The pair of terminals 31 and 32 protrude from the resin housing 20 at positions sandwiching the nut accommodating opening 21, and are bent so as to overlap each other on the nut accommodating opening 21.

5 Claims, 7 Drawing Sheets

(51) Int. Cl.
  *H01L 25/07* (2006.01)
  *H01L 25/18* (2023.01)
(52) U.S. Cl.
  CPC .. *H01L 23/49555* (2013.01); *H01L 23/49575* (2013.01); *H01L 25/072* (2013.01); *H01L 25/18* (2013.01)

(56) References Cited

U.S. PATENT DOCUMENTS

| | | | | |
|---|---|---|---|---|
| 2002/0062973 A1* | 5/2002 | Yamada | .................. | H01L 24/49 257/E23.14 |
| 2002/0190374 A1* | 12/2002 | Nakajima | ............... | H01L 24/49 257/713 |
| 2019/0252276 A1 | 8/2019 | Murakami et al. | | |

\* cited by examiner

--Prior Art--

--Prior Art--

SEMICONDUCTOR DEVICE

This application is a National Stage Application of PCT/JP2020/43338, filed Nov. 20, 2020, which claims the priority of Japanese Patent Application No. 2020-051584, filed Mar. 23, 2020.

TECHNICAL FIELD

The present invention relates to a semiconductor device, and more particularly to improvement of the semiconductor device in which a nut accommodating opening for embedding a terminal nut is formed on a resin housing that seals a semiconductor element, and an external terminal fastening hole is arranged on the nut accommodating opening.

BACKGROUND ART

Semiconductor devices in which power semiconductor elements, such as thyristors, diodes, and transistors, are sealed with resin have been conventionally known (e.g., Patent Literature 1). FIG. 6 is a cross-sectional view showing an example of a conventional semiconductor device. A semiconductor element 50 is arranged on a heat radiating plate 10, and an external terminal 30 is connected to the semiconductor element 50. A resin housing 20 is formed on an upper surface side of the heat radiating plate 10 to seal the semiconductor element 50 and part of the external terminal 30. Further, a nut accommodating opening 21 for accommodating a terminal nut 40 is formed on an upper surface of the resin housing 20.

The external terminal 30 protrudes upward from the upper surface of the resin housing 20, and is bent toward the nut accommodating opening 21 outside the resin housing 20. A fastening hole 33 is formed near a tip of the external terminal 30, so that by bending the external terminal 30, the tip of external terminal 30 is arranged to cover the nut accommodating opening 21 and the fastening hole 33 is arranged to correspond to the nut accommodating opening 21.

There is a problem that such an external terminal 30 of the semiconductor device is lifted when an external force is applied through wiring. FIG. 7 is a diagram showing a state in which the external terminal 30 is lifted. A wiring 41 is attached to a terminal fitting 42. A fastening screw 43 is inserted through a fastening hole of the terminal fitting 42 and the fastening hole 33 of the external terminal 30, and the fastening screw 43 and the terminal nut 40 are fastened to connect the wiring 41 with the external terminal 30.

When an external force in a pulling direction is applied to the wiring 41, there is a problem that the external terminal 30 is lifted as shown in the drawing. Then, when such a lift is repeated, a bent portion of the external terminal 30 may break.

Further, a method for solving such a problem has been conventionally proposed (e.g., Patent Literature 2). Patent Literature 2 describes a configuration in which an external terminal is extended, bent downward, and embedded in a molding resin inside an outer case, and a configuration in which the external terminal is integrally molded with an upper case lid. Further, Patent Literature 2 describes a configuration in which an auxiliary terminal fitting is inserted into an opening hole in the outer case, and a configuration in which the auxiliary terminal fitting is locked and fixed to a hook of the outer case. By adopting these configurations, it is considered that the external terminal can be supported not by one point but by two points, and a lift of the external terminal can be suppressed.

CITATION LIST

Patent Literatures

Patent Literature 1: JP H5-136333 A
Patent Literature 2: JP H6-120390 A

SUMMARY OF INVENTION

Technical Problem

However, in a conventional semiconductor device, in order to prevent a lift of an external terminal, it is necessary to add a new member, such as an auxiliary terminal fitting, only for the purpose of reinforcement, or add a new process, such as insertion of an anchor portion into a case. Therefore, there is a problem that the manufacturing process becomes complicated.

The present invention has been made in view of the above circumstances, and it is therefore an object of the present invention to suppress a lift of the external terminal when an external force is applied, thereby improving the reliability of a semiconductor device. In particular, it is an object of the present invention to suppress the lift of the external terminal without complicating the manufacturing process as compared with the conventional semiconductor device.

Solution to Problem

A semiconductor device according to a first aspect of the present invention includes a heat radiating plate having on one main surface a circuit area in which at least one semiconductor element is arranged, a pair of terminals that are connected to the semiconductor element, and have fastening holes, and a resin housing that covers the circuit area of the heat radiating plate to seal the semiconductor element, and has a terminal surface formed on a top surface, a pair of side surfaces in a longitudinal direction, and a pair of front and rear surfaces in a lateral direction. The resin housing has a nut accommodating opening formed on the terminal surface for embedding a terminal nut. The resin housing has a pair of bending contact portions that come into respectively contact with the pair of terminals to define bending positions of the terminals. One of bending contact portions corresponding to one of the terminals and the other of bending contact portions corresponding to the other of the terminals are formed to have different heights. The pair of terminals protrude from the resin housing at positions sandwiching the nut accommodating opening, and are bent so as to overlap each other on the nut accommodating opening. The fastening holes face the nut accommodating opening.

By adopting the above configuration, one external terminal is formed by the pair of terminals, and the pair of terminals are supported by the resin housing at two positions sandwiching the nut accommodating opening. Therefore, it is possible to prevent the external terminal from being lifted when an external force is applied via the wiring.

Further, since one external terminal and the circuit area in the resin housing are connected via the pair of terminals, a wiring resistance from the circuit area to the external terminal can be reduced.

In addition, since it is not necessary to adopt a new member different from the conventional semiconductor device and to add a new manufacturing process, it does not make the manufacturing process complicated and it is possible to realize stable manufacturing.

Further, it is possible to prevent variations in the bending positions of the terminals that cause the fastening holes of the bent terminals from becoming incompatible with the nut accommodating openings. Therefore, it is possible to facilitate a bending work of the terminal in the manufacturing process. Further, by making the heights of the pair of bending contact portions different, the pair of terminals can be bent so as to appropriately overlap each other.

In the semiconductor device according to a second aspect of the present invention, in addition to the above configuration, the pair of terminals protrude from the side surfaces of the resin housing in a direction away from each other. The terminals bent along the pair of side surfaces are further bent so as to overlap each other on the nut accommodating opening, and the fastening holes face the nut accommodating opening.

In the semiconductor device according to a third aspect of the present invention, in addition to the above configuration, overlapping portions of the pair of terminals are substantially parallel.

By adopting the above configuration, it is possible to prevent deformation of the terminals due to sandwiching the pair of terminals between the fastening screw and the terminal nut, and it is possible to improve the reliability of the semiconductor device.

In the semiconductor device according to a fourth aspect of the present invention, in addition to the above configuration, one of the pair of bending contact portions is a protrusion formed on an edge portion of the terminal surface.

In the semiconductor device according to a fifth aspect of the present invention, in addition to the above configuration, one of bending contact portions is an edge portion of the terminal surface, and another of bending contact portions is a protrusion formed on an edge portion of the terminal surface.

By adopting the above configuration, it is possible to visually distinguish one terminal to be bent earlier and the other terminal to be bent later. Therefore, when the pair of terminals are bent during manufacturing, it is possible to prevent the terminals from being bent in an erroneous order.

In the semiconductor device according to a sixth aspect of the present invention, in addition to the above configuration, the edge portion of the terminal surface has a pair of step portions that includes a wall having a groove shape formed from an upper end of the terminal surface to the side surface and a surface formed between a lower end of the wall and the side surface. Each of the pair of terminals protrudes outside the housing from the surface of the step portion, and the terminals bent along the side surfaces are arranged in the walls having the groove shape.

By adopting the above configuration, at least part of the terminal is housed in the groove-shaped wall, and it is possible to prevent the terminal from being bent with diagonal twist. In addition, when the terminal is diagonally bent, it can be easily and visually confirmed.

In the semiconductor device according to a seventh aspect of the present invention, in addition to the above configuration, the pair of bending contact portions are a pair of protrusions with different heights formed on the edge portions of the terminal surface.

In the semiconductor device according to an eighth aspect of the present invention, in addition to the above configuration, the resin housing is formed by using a transfer molding method.

By adopting the above configuration, the pair of terminals are partially embedded in the integrally-molded resin housing, and thus the pair of terminals are firmly supported by the resin housing. Therefore, a lift of the external terminal can be effectively suppressed. Further, since the pair of terminals can be resin-sealed at the same time, the present invention is achieved without complicating the manufacturing process as compared with the conventional semiconductor device.

Advantageous Effects of Invention

In a semiconductor device according to the present invention, an external terminal is supported by a resin housing at two positions facing each other with the nut accommodating opening therebetween. Therefore, it is possible to suppress a lift of the external terminal when an external force is applied, and improve the reliability of the semiconductor device. In particular, as compared with a conventional semiconductor device, it is possible to suppress the lift of the external terminal without complicating the manufacturing process.

DESCRIPTION OF EMBODIMENT

Hereinafter, an embodiment of the present invention will be described with reference to the drawings. In the present specification, for convenience, a heat radiating plate is arranged on a lower surface of a semiconductor device, and a terminal surface is formed on an upper surface of the semiconductor device. However, the posture in use of the semiconductor device according to the present invention is not limited.

Figure 1:
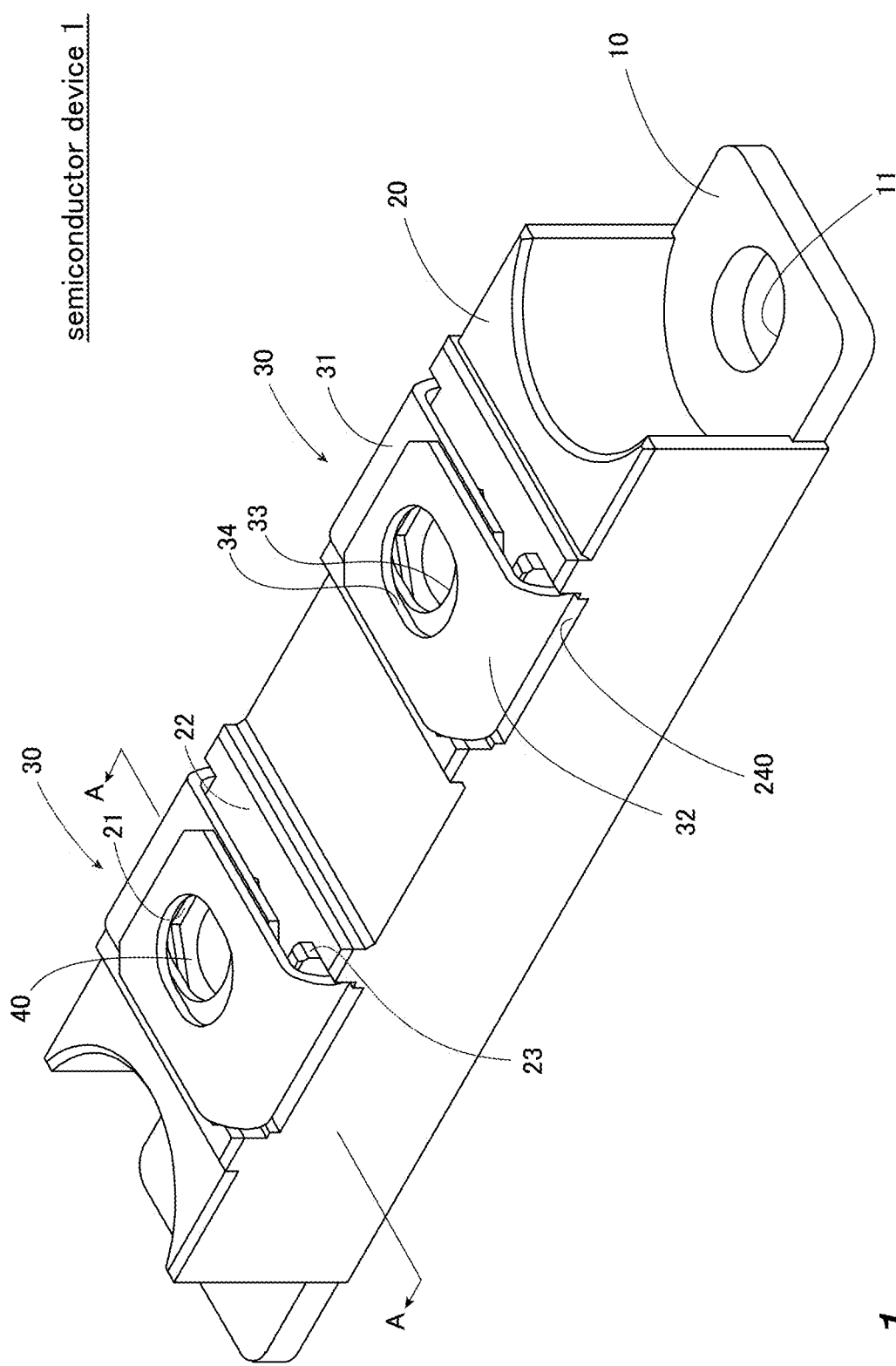
FIG. 1 is a perspective view showing an example of a configuration of a semiconductor device 1 according to the embodiment of the present invention.

FIG. 1 is a perspective view showing an example of a configuration of a semiconductor device 1 according to the embodiment of the present invention. The semiconductor device 1 is configured by sealing a circuit area formed on an upper surface of a heat radiating plate 10 with a resin housing 20, and two external terminals 30 are formed on an upper surface of the resin housing 20. Each of the external terminals 30 is configured with a pair of first terminal 31 and second terminal 32 arranged so as to partially overlap each other.

A nut accommodating opening 21 for embedding a terminal nut 40 is formed on a terminal surface 22 formed at a position higher than the upper surface of the resin housing 20. Further, first and second fastening holes 33 and 34 are formed in a pair of first and second terminals 31 and 32, respectively. By arranging these first and second fastening holes 33 and 34 at positions corresponding to the nut accommodating opening 21, a fastening screw (not shown) can be inserted through the two first and second fastening holes 33 and 34 to engage with terminal nut 40.

The first and second terminals 31 and 32 are connected to a semiconductor element sealed in the resin housing 20, and partially protruded from the resin housing 20 in a direction away from each other at positions sandwiching the nut accommodating opening 21. Portions of the first and second terminals 31 and 32 exposed to the outside of the resin housing 20 are bent upward in the vertical direction, and then bent toward the nut accommodating opening 21. In this way, tips of the pair of first terminal 31 and second terminal 32 are arranged so as to overlap each other on the nut accommodating opening 21. Here, the first and second fastening holes 33 and 34 of the pair of first and second terminals 31 and 32 are arranged so as to face the nut accommodating opening 21 formed on the terminal surface 22 of the resin housing 20.

The external terminal 30 is configured with the pair of first and second terminals 31 and 32, and these first and second terminals 31 and 32 are firmly supported by the resin housing 20 at two positions on opposite sides of the terminal nut 40 of the resin housing 20. Therefore, it is possible to prevent the external terminal 30 from being lifted by an external force. Further, wiring resistance can be reduced to suppress a loss by fastening the two first and second terminals 31 and 32 configuring one external terminal 30 so as to be in close contact with each other with the fastening screw.

Figure 2:
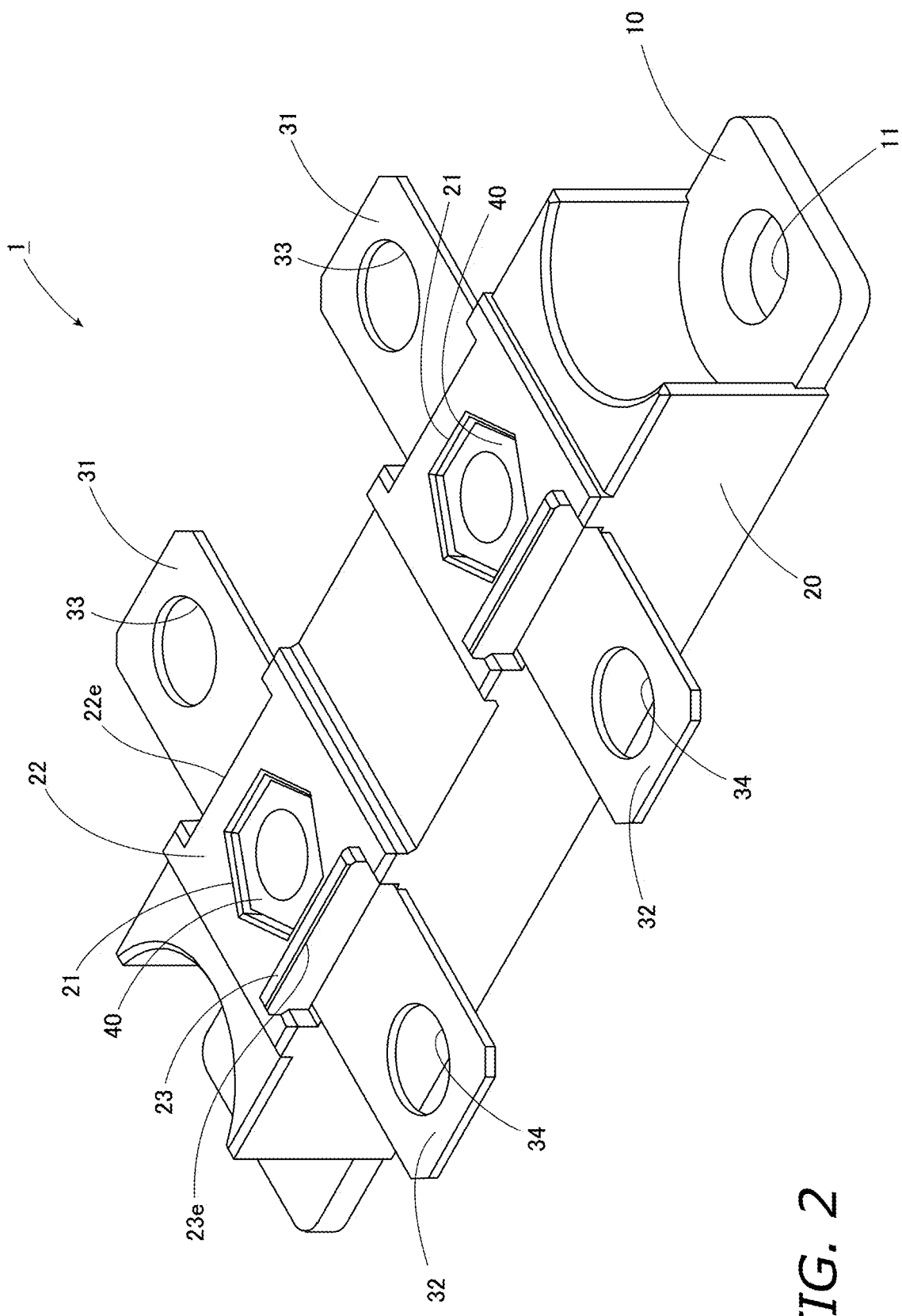
FIG. 2 is a diagram showing an example of a state of the semiconductor device 1 in FIG. 1 in a manufacturing process, and the state before bending the first and second terminals 31 and 32 are shown therein.
Figure 3:
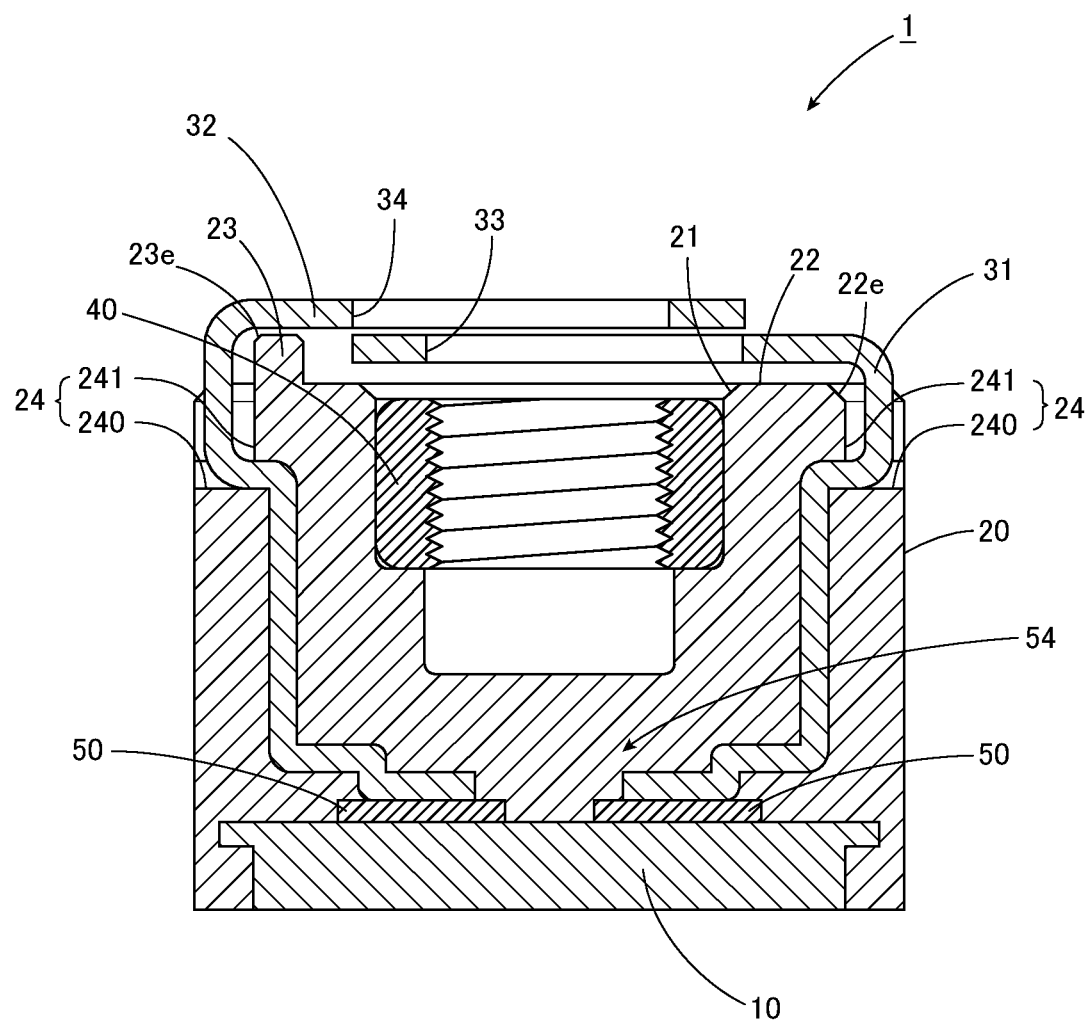
FIG. 3 is a diagram showing an example of an internal configuration of the semiconductor device 1 in FIG. 1, and is a cross-sectional view when the semiconductor device 1 is cut along the A-A cutting line in FIG. 1.
Figure 4:
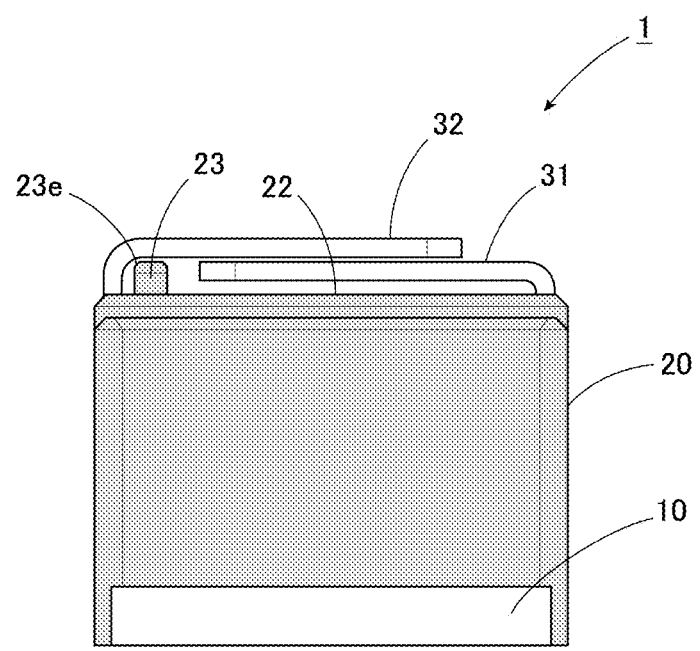
FIG. 4 is a side view showing an example of a detailed configuration of an appearance of the semiconductor device 1 in FIG. 1.
Figure 5:
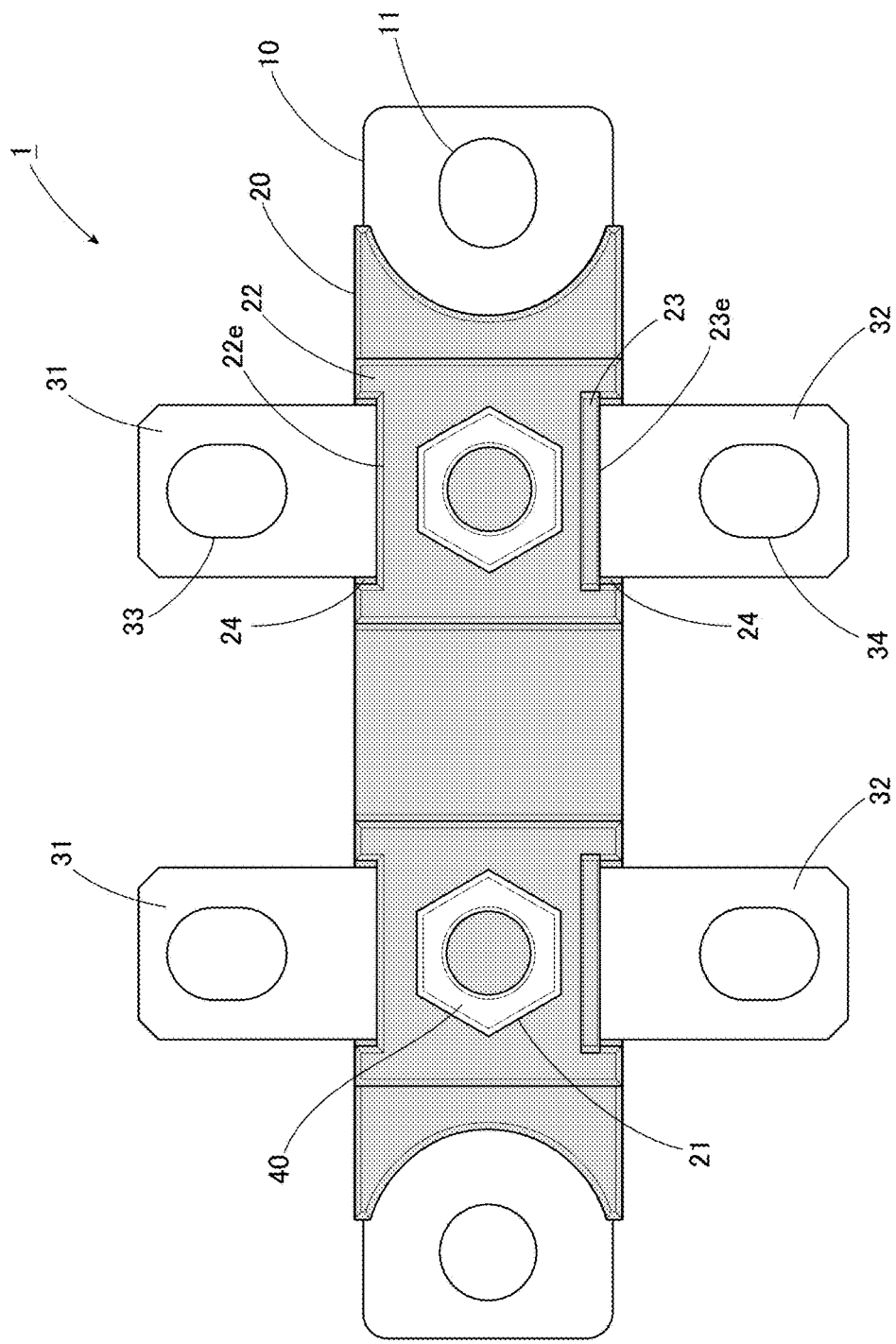
FIG. 5 is a plan view showing the state before bending the first and second terminals 31 and 32.
Figure 6:
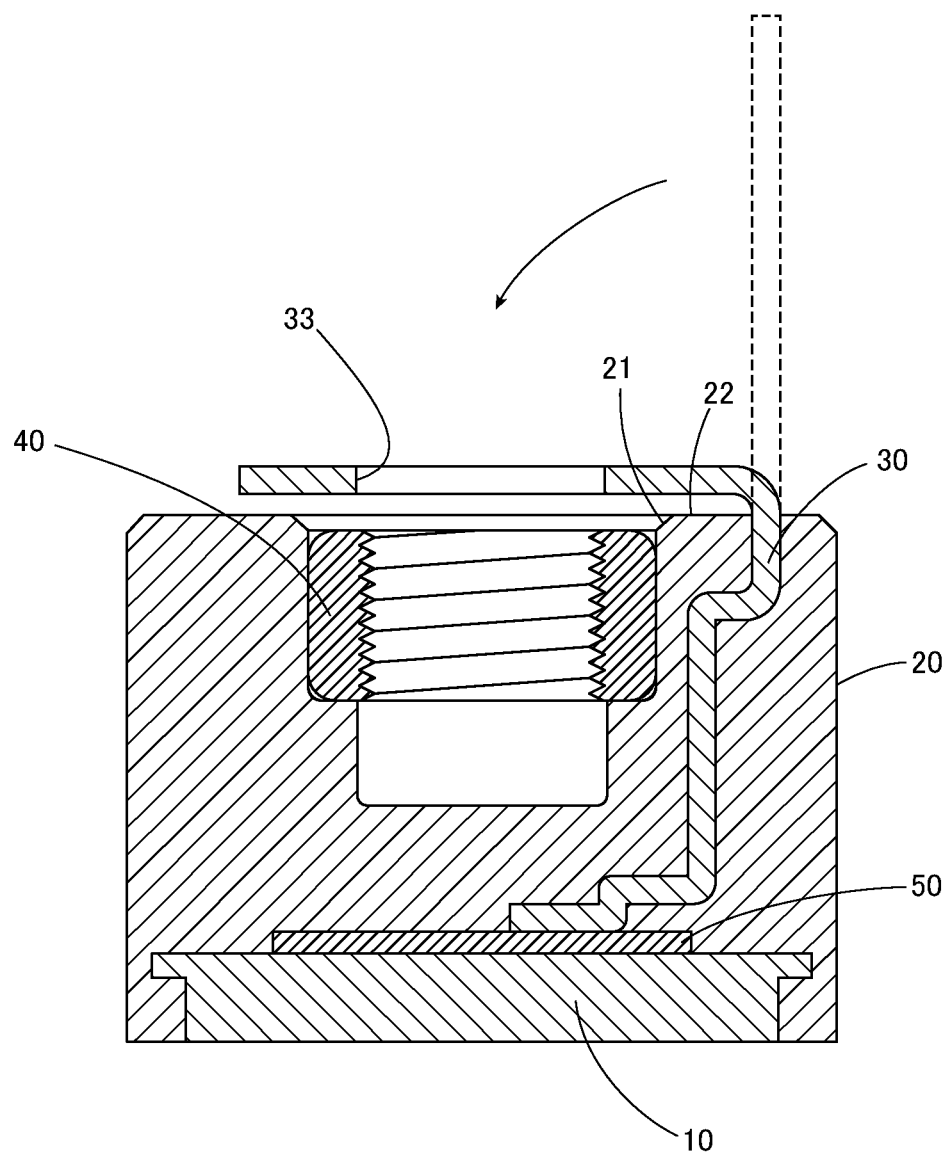
FIG. 6 is a cross-sectional view showing an example of a conventional semiconductor device.
Figure 7:
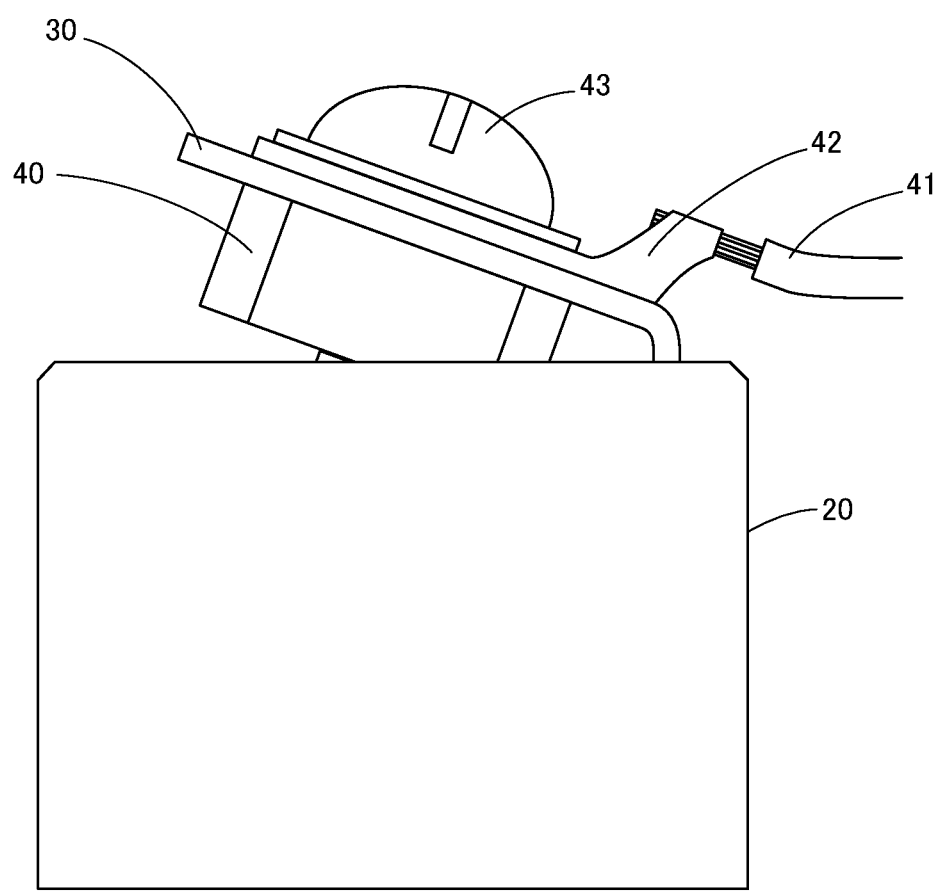
FIG. 7 is a diagram showing a state in which the external terminal 30 is lifted.

FIG. 2 is a diagram showing an example of a state of the semiconductor device 1 in FIG. 1 in a manufacturing process, and the state before bending the first and second terminals 31 and 32 are shown therein. Further, FIG. 3 is a diagram showing an example of an internal configuration of the semiconductor device 1 in FIG. 1, and is a cross-sectional view when the semiconductor device 1 is cut along the A-A cutting line in FIG. 1. Further, FIG. 4 is a side view showing an example of a detailed configuration of an appearance of the semiconductor device 1 in FIG. 1. Further, FIG. 5 is an external view showing an example of a state of the semiconductor device 1 in FIG. 1 in the manufacturing process, and is a plan view showing the state before bending the first and second terminals 31 and 32.

The heat radiating plate 10 has a plate-like body with an elongated shape, and a material with good thermal conductivity is used. For example, a nickel-plated copper plate can be used. Mounting holes 11 for mounting onto a mounting surface (not shown) are provided at both ends of the heat radiating plate 10 in the longitudinal direction. Further, a circuit area 54 interposed between two mounting holes 11 is formed on the upper surface of the heat radiating plate 10, and one or more semiconductor elements 50 are arranged. For example, a power semiconductor element for power supply circuit, such as a diode, thyristor, and transistor, is arranged.

The pair of first and second terminals 31 and 32 are soldered to one or more semiconductor elements 50. The pair of first and second terminals 31 and 32 may be connected to the same semiconductor element 50 or may be connected to different semiconductor elements 50. However, the pair of first and second terminals 31 and 32 need to be connected to the same electric potential in the circuit area 54 since they configure one external terminal 30 outside the resin housing 20.

Lower ends of the pair of first and second terminals 31 and 32 are connected to the semiconductor element 50. The first and second terminals 31 and 32 extend vertically upward within a range in a width direction of the heat radiating plate 10, are bent at a substantially right angle toward the outside at a height position of a step surface 240, described later, below the terminal surface 22, and protrude from the resin housing 20. More specifically, the pair of first and second terminals 31 and 32 protrude from the resin housing 20 in a horizontal plane toward the outside in the width direction of the heat radiating plate 10, i.e., in a direction away from each other at positions sandwiching the nut accommodating opening 21.

After the first and second terminals 31 and 32 are connected to the semiconductor element 50 on the upper surface of the heat radiating plate 10 and a circuit is formed, the resin housing 20 is formed on the upper surface and a side surface of the heat radiating plate 10 by the transfer molding method. The resin housing 20 is formed so as to cover the circuit area 54 of the heat radiating plate 10, seals the semiconductor element 50, and also seals part of the first and second terminals 31 and 32. A lower surface of the heat radiating plate 10 is exposed without being sealed. Therefore, the heat radiating plate 10 can be brought into close contact with the mounting surface, and heat can be radiated efficiently.

After the resin housing 20 is formed, the first terminal 31 is first bent upward, and then further bent over the nut accommodating opening 21 toward the terminal surface 22. After that, the second terminal 32 is bent upward, further bent in a direction of the nut accommodating opening 21 on the terminal surface 22, and superposed on the first terminal 31.

Here, shapes of portions of the first and second terminals 31 and 32 protruding from the resin housing 20 will be described mainly with reference to FIGS. 3 to 5. The nut accommodating opening 21 is formed on the horizontal terminal surface 22 on the upper surface of the resin housing 20. As seen in FIG. 3, left and right edge portions of the terminal surface 22 have a groove-shaped step wall 241 formed from the side surface to the inside of the resin housing 20 and downward from the top surface, and a horizontal step surface 240 formed from a lower end of the step wall 241 to the side surface of the resin housing 20. The step surface 240 and the step wall 241 configure a step portion 24.

The first and second terminals 31 and 32 are protruded from the resin housing 20 from the step surface 240 in opposite directions at positions sandwiching the nut accommodating opening 21, respectively. Then, each of the first and second terminals 31 and 32 is bent upward from the step surface 240 along the step wall 241. Here, the first and second terminals 31 and 32 are housed within the groove-shaped step walls 241, respectively, so that the first and second terminals 31 and 32 cannot protrude from the side surfaces of the resin housing 20 in the width direction.

Since the first and second terminals 31 and 32 are housed in the step wall 241, it is possible to prevent the first and second terminals 31 and 32 from being bent with diagonal twist. Therefore, it is desirable that the thickness of the step wall 241 is at least the thickness of the first and second terminals 31 and 32. On the other hand, even when only part of the first and second terminals 31 and 32 in the thickness direction enters the inside of the step wall 241, twisting of the first and second terminals 31 and 32 can be prevented. In that respect, the thickness of the step wall 241 is not necessarily limited to this thickness.

Further, since a part or all of the first and second terminals 31 and 32 is housed in the step wall 241, even when the first and second terminals 31 and 32 are diagonally bent, it has an effect of easily and visually confirming a manufacturing defect.

A straight edge that bends from the terminal surface 22 to the step wall 240 is formed. The edge corresponding to the first terminal 31 is used as a first bending contact portion 22e. On the other hand, on the edge of the terminal surface 22 on which the step surface 240 corresponding to the second terminal 32 is formed, a protrusion 23 protruding upward from the terminal surface 22 is formed, and an edge is formed on an upper outer edge portion of the protrusion 23. The edge is used as a second bending contact portion 23e.

Here, when the width of the first and second bending contact portions 22e and 23e is narrower than the width of the first and second terminals 31 and 32, part of the first and second terminals 31 and 32 is bent without restriction of a bending position. It is conceivable that the second fastening hole 34 of the second terminal 32 does not correspond to the nut accommodating opening 21 or the second terminal 32 is not parallel to the terminal surface 22. Therefore, the first bending contact portion 22e has a linear shape extending in the width direction of the first terminal 31, and has a width equal to or larger than the width of the first terminal 31. Similarly, the second bending contact portion 23e has a linear shape extending in the width direction of the second terminal 32, and has a width equal to or larger than the width of the second terminal. Since the first and second bending contact portions 22e and 23e have a width equal to or larger than the width of the first and second terminals 31 and 32, the entire first and second terminals 31 and 32 can come into contact with the first and second bending contact portions 22e and 23e to bent at predetermined positions.

The first terminal 31 comes into contact with the first bending contact portion 22e when bent in the direction of the nut accommodating opening 21, and is bent with the first bending contact portion 22e as a fulcrum. Therefore, a bending height position is defined by the first bending contact portion 22e. On the other hand, the second terminal 32 comes into contact with the second bending contact portion 23e when bent in the direction of the nut accommodating opening 21, and is bent with the second bending contact portion 23e as a fulcrum. Therefore, a bending height position is defined by the second bending contact portion 23e. Thus, the pair of first and second terminals 31 and 32 can be bent at different heights from the terminal surface 22.

With respect to the heights of the pair of bent first and second terminals 31 and 32 from the terminal surface 22, the second terminal 32 is higher than that of the first terminal 31, and the difference substantially matches a height of the protrusion 23. Therefore, by appropriately determining the height of the protrusions 23 in advance, the pair of first and second terminals 31 and 32 can be bent so as to appropriately overlap each other. For example, by making the height of the protrusion 23 substantially match the thickness of the first terminal 31, overlapping portions of the first and second terminals 31 and 32 are arranged so as to be adjacent to each other and substantially parallel to each other.

Further, since the protrusion 23 is provided only on the second terminal 32 side, the first terminal 31 to be bent first and the second terminal 32 to be bent later can be easily distinguished. Therefore, it is possible to prevent the second terminal 32 from being accidentally bent first during manufacturing.

The first and second fastening holes 33 and 34 of the first and second terminals 31 and 32 are provided at predetermined positions of the first and second terminals 31 and 32, and the first and second terminals 31 and 32 can always be bent at predetermined height positions by the first and second bending contact portions 22e and 23e. Thus, the first and second fastening holes 33 and 34 are stably provided at positions corresponding to the nut accommodating opening 21, and it is possible to prevent the first and second fastening holes 33 and 34 from becoming not corresponding to the nut accommodating opening 21, due to variations in bending positions. As a result, the semiconductor device 1 can be stably manufactured.

Further, the first and second terminals 31 and 32 are bent toward the nut accommodating opening 21 outside the resin housing 20, and the tips thereof are arranged on the terminal surface 22. More specifically, the first and second terminals 31 and 32 protrude outside the resin housing 20 in a state of being bent in opposite directions, and then approach toward the nut accommodating opening 21 from the opposite sides sandwiching the nut accommodating opening 21 to overlap each other on the terminal surface 22. In this state, the first and second fastening holes 33 and 34 are arranged so as to correspond to the nut accommodating opening 21. Therefore, the fastening screw can be inserted through the first and second fastening holes 33 and 34 to further engage with the terminal nut 40.

The protrusion 23 has an elongated shape extending linearly in the width direction of the second terminal 32, and preferably has a width equal to or larger than the width of the second terminal 32. However, the present invention is not limited to this configuration. For example, the protrusion 23 may have a width shorter than the width of the second terminal 32, as long as the protrusion 23 has the second bending contact portion 23e. Further, two or more protrusion shapes arranged in the width direction can be provided as the protrusion 23. Further, in this example, the protrusion 23 is formed only on the side corresponding to the second terminal 32, but protrusions 23 with different heights may be formed on both sides corresponding to the first and second terminals 31 and 32.

The present embodiment describes an example in which the second bending contact portion 23e has a linear shape extending in the width direction of the second terminal 32 and has a width equal to or larger than the width of the second terminal 32. However, the present invention is not limited to this configuration. The second bending contact portion 23e may come into contact with part of the second terminal 32 in the width direction as long as the second bending contact portion 23e can define the bending position of the second terminal 32. For example, the second bending contact portion 23e may come into contact with the second terminal 32 at one point or at two or more points arranged in the width direction.

Similarly, the present embodiment describes the case where the first bending contact portion 22e also has a linear shape extending in the width direction of the first terminal 31 and has a width equal to or larger than the width of the first terminal 31, but the present invention is not limited to this configuration. The first bending contact portion 22e may come into contact with part of the first terminal 31 in the width direction as long as the first bending contact portion 22e defines the bent position of the first terminal 31. For example, the first bending contact portion 22e may come into contact with the first terminal 31 at one point or at two or more points arranged in the width direction.

Further, the present embodiment describes an example in which one semiconductor device 1 is provided with two external terminals 30, but the present invention is not limited to this configuration. Alternatively, one external terminal or three or more external terminals 30 may be provided in one semiconductor device 1.

Further, the present embodiment describes an example in which the pair of first and second terminals 31 and 32 are separated also inside the resin housing 20, but the pair of first and second terminals 31 and 32 may be connected inside the resin housing 20. For example, one terminal may be drawn out of the resin housing 20 in directions of both side surfaces to use one terminal as the pair of first and second terminals 31 and 32.

DESCRIPTION OF REFERENCE NUMERALS

1 semiconductor device
10 heat radiating plate
11 mounting hole
20 resin housing
21 nut accommodating opening
22 terminal surface
22e first bending contact portion
23 protrusion
23e second bending contact portion
24 step portion
240 step surface
241 step wall
30 external terminal
31 first terminal
32 second terminal
33 first fastening hole
34 second fastening hole
40 terminal nut
41 wiring
42 terminal fitting
43 fastening screw
50 semiconductor element
54 circuit area

The invention claimed is:

1. A semiconductor device comprising:
a heat radiating plate having a circuit area in which at least one semiconductor element is arranged, the circuit area being provided on one main surface;
a pair of terminals that are connected to the at least one semiconductor element, and have fastening holes; and
a resin housing that covers the circuit area of the heat radiating plate to seal the at least one semiconductor element, and has a terminal surface formed on a top surface, a pair of side surfaces in a longitudinal direction, and a pair of front and rear surfaces in a lateral direction, the resin housing having a nut accommodating opening formed on the terminal surface for embedding a terminal nut, wherein
the resin housing has a pair of bending contact portions that come into respectively contact with the pair of terminals to define bending positions of the terminals,
one of the pair of bending contact portions corresponding to one of the pair of terminals and another of the pair of bending contact portions corresponding to another of the pair of terminals are formed to have different heights,
the pair of terminals protrude from the resin housing at positions sandwiching the nut accommodating opening, and are bent so as to overlap each other on the nut accommodating opening,
the fastening holes face the nut accommodating opening,
one of the pair of bending contact portions is a protrusion formed on an edge portion of the terminal surface, and
the edge portion of the terminal surface has a pair of step portions including walls formed downward from an upper end of the terminal surface and surfaces formed between a lower end of the walls and the side surfaces, the pair of terminals protruding from the walls outside the resin housing along the surface of the pair of step portions, and being bent along the walls to be arranged in areas of the pair of the step portions.

2. The semiconductor device according to claim 1, wherein the pair of terminals protrude toward the pair of side surfaces of the resin housing in a direction away from each other, the pair of terminals bent toward each of the pair of side surfaces.

3. The semiconductor device according to claim 1, wherein overlapping portions of the pair of terminals are substantially parallel.

4. The semiconductor device according to claim 1, wherein the pair of bending contact portions are a pair of protrusions with different heights formed on edge portions of the terminal surface.

5. The semiconductor device according to claim 1, wherein the resin housing is formed by using a transfer molding method.

* * * * *